US006602613B1

(12) United States Patent
Fitzgerald

(10) Patent No.: US 6,602,613 B1
(45) Date of Patent: Aug. 5, 2003

(54) HETEROINTEGRATION OF MATERIALS USING DEPOSITION AND BONDING

(75) Inventor: Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 09/764,182

(22) Filed: Jan. 17, 2001

Related U.S. Application Data

(60) Provisional application No. 60/177,084, filed on Jan. 20, 2000.

(51) Int. Cl.[7] .................. B32B 15/00; C30B 29/40
(52) U.S. Cl. .............. 428/641; 428/642; 428/446; 428/450; 428/697; 428/698; 428/699; 428/704; 117/953
(58) Field of Search .................. 428/446, 450, 428/688, 689, 697, 700, 702, 641, 642, 704, 699; 117/953

(56) References Cited

U.S. PATENT DOCUMENTS

| | | | |
|---|---|---|---|
| 4,010,045 A | 3/1977 | Ruehrwein | 117/102 |
| 5,013,681 A | 5/1991 | Godbey et al. | 438/459 |
| 5,166,084 A | 11/1992 | Pfiester | 438/151 |
| 5,202,284 A * | 4/1993 | Kamins et al. | 117/106 |
| 5,207,864 A | 5/1993 | Bhat et al. | 156/633 |
| 5,208,182 A | 5/1993 | Narayan et al. | |
| 5,212,110 A | 5/1993 | Pfiester et al. | 438/222 |
| 5,221,413 A | 6/1993 | Brasen et al. | 117/98 |
| 5,285,086 A * | 2/1994 | Fitzgerald, Jr. | 257/185 |
| 5,310,451 A | 5/1994 | Tejwani et al. | 438/459 |
| 5,346,848 A | 9/1994 | Grupen-Shemansky et al. | 437/61 |
| 5,374,564 A | 12/1994 | Bruel | 437/24 |
| 5,413,679 A | 5/1995 | Godbey | 438/702 |

(List continued on next page.)

FOREIGN PATENT DOCUMENTS

| | | |
|---|---|---|
| EP | 0 587 520 | 3/1994 |
| EP | 0 683 522 | 11/1995 |
| EP | 0 828 296 | 3/1998 |
| JP | 2000-31491 | 1/2000 |
| JP | 2001319935 | 11/2001 |
| WO | WO 98/59365 | 12/1998 |
| WO | WO 99/53539 | 10/1999 |
| WO | WO 00/48239 | 8/2000 |
| WO | WO 01/54202 | 7/2001 |
| WO | WO 01/99169 A2 | 12/2001 |
| WO | WO 02/15244 A2 | 2/2002 |
| WO | WO 02/27783 A1 | 4/2002 |
| WO | WO 02/071495 A1 | 9/2002 |
| WO | WO 02/082514 A1 | 10/2002 |

OTHER PUBLICATIONS

"Relaxed $Ge_x Si_{1-x}$ structures for III–V integration with Si and high mobility two dimensional electron gases in Si", by Fitzgerald et al.; AT&T Bell Laboratories, Murray Hill, NJ 07974; 1992 American Vacuum Society; pp.> 1807–1819 No Month.

(List continued on next page.)

*Primary Examiner*—Deborah Jones
*Assistant Examiner*—Stephen Stein
(74) *Attorney, Agent, or Firm*—Testa, Hurwitz & Thibeault, LLP

(57) ABSTRACT

A semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In another embodiment, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

69 Claims, 7 Drawing Sheets

U.S. PATENT DOCUMENTS

| | | | |
|---|---|---|---|
| 5,442,205 A | 8/1995 | Brasen et al. | 257/191 |
| 5,461,243 A | 10/1995 | Ek et al. | 257/190 |
| 5,462,883 A | 10/1995 | Dennard et al. | |
| 5,476,813 A | 12/1995 | Naruse | 438/311 |
| 5,484,664 A * | 1/1996 | Kitahara et al. | 257/190 |
| 5,523,592 A | 6/1996 | Nakagawa et al. | 257/96 |
| 5,534,713 A | 7/1996 | Ismail et al. | 257/24 |
| 5,536,361 A | 7/1996 | Kondo et al. | |
| 5,540,785 A | 7/1996 | Dennard et al. | 148/33.2 |
| 5,683,934 A | 11/1997 | Candelaria | 438/151 |
| 5,728,623 A | 3/1998 | Mori | |
| 5,759,898 A | 6/1998 | Ek et al. | 438/291 |
| 5,792,679 A | 8/1998 | Nakato | 438/162 |
| 5,877,070 A | 3/1999 | Goesele et al. | 438/458 |
| 5,891,769 A | 4/1999 | Hong et al. | 438/167 |
| 5,906,708 A | 5/1999 | Robinson et al. | 438/694 |
| 5,906,951 A | 5/1999 | Chu et al. | |
| 5,943,560 A | 8/1999 | Chang et al. | 438/151 |
| 5,966,622 A | 10/1999 | Levine et al. | 438/459 |
| 5,998,807 A | 12/1999 | Lustig et al. | 257/66 |
| 6,033,974 A | 3/2000 | Henley et al. | 438/526 |
| 6,033,995 A | 3/2000 | Muller | |
| 6,059,895 A | 5/2000 | Chu et al. | |
| 6,074,919 A | 6/2000 | Gardner et al. | 438/287 |
| 6,096,590 A | 8/2000 | Chan et al. | 438/233 |
| 6,103,559 A | 8/2000 | Gardner et al. | 438/183 |
| 6,107,653 A * | 8/2000 | Fitzgerald | 257/191 |
| 6,111,267 A | 8/2000 | Fischer et al. | 257/19 |
| 6,117,750 A | 9/2000 | Bensahel et al. | 438/478 |
| 6,153,495 A | 11/2000 | Kub et al. | 372/45 |
| 6,154,475 A | 11/2000 | Soref et al. | 438/459 |
| 6,162,688 A | 12/2000 | Gardner et al. | 438/289 |
| 6,184,111 B1 | 2/2001 | Henley et al. | 438/514 |
| 6,191,007 B1 | 2/2001 | Matsui et al. | 438/459 |
| 6,191,432 B1 | 2/2001 | Sugiyama et al. | 257/19 |
| 6,194,722 B1 | 2/2001 | Fiorini et al. | 250/338.1 |
| 6,207,977 B1 | 3/2001 | Augusto | 257/192 |
| 6,210,988 B1 | 4/2001 | Howe et al. | 438/50 |
| 6,218,677 B1 | 4/2001 | Broekaert | 257/22 |
| 6,235,567 B1 | 5/2001 | Huang | 438/510 |
| 6,251,755 B1 | 6/2001 | Furukawa et al. | 438/510 |
| 6,261,929 B1 * | 7/2001 | Gehrke et al. | 438/462 |
| 6,291,321 B1 * | 9/2001 | Fitzgerald | 438/494 |
| 6,313,016 B1 | 11/2001 | Kibbel et al. | 438/478 |
| 6,323,108 B1 | 11/2001 | Kub et al. | 438/458 |
| 6,329,063 B2 | 12/2001 | Lo et al. | 428/450 |
| 6,335,546 B1 | 1/2002 | Tsuda et al. | 257/192 |
| 6,350,993 B1 | 2/2002 | Chu et al. | 257/19 |
| 6,368,733 B1 * | 4/2002 | Nishinaga | 428/698 |
| 6,372,356 B1 * | 4/2002 | Thornton et al. | 257/189 |
| 2001/0003269 A1 | 6/2001 | Wu et al. | 117/94 |
| 2003/0003679 A1 | 1/2003 | Doyle et al. | |

OTHER PUBLICATIONS

"Demonstration of a GaAs–Based Complian Substrate Using Wafer Bonding and Substrate Removal Techniques"; by Zhang et al.; Electronic Materials and Processing Research Laboratory, Department of Electrical Engineering, University Park, PA 16802; pp. 25–28.

U.S. patent application Ser. No. 09/289,514, Wu et al., filed Apr. 9, 1999.

U.S. patent application Ser. No. 09/599,260, Wu et al., filed Jun. 22, 2000.

U.S. patent application Ser. No. 09/198,960, Fitzgerald et al., filed Nov. 24, 1998.

IBM Technical Disclosure Bulletin, vol. 32, No. 8A, Jan. 1990, "Optimal Growth Technique and Structure for Strain Relaxation of Si–Ge Layers on Si Substrates", pp. 330–331.

Maszara, "Silicon–On–Insulator by Wafer Bonding: A Review," *Journal of the Electrochemical Society*, No. 1 (Jan. 1991) pp. 341–347.

Chang et al., "Selective Etching of SiGe/Si Heterostructures," *Journal of the Electrochemical Society*, No. 1 (Jan. 1991) pp. 202–204.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991) pp. 811–813.

Feijoo et al., "Epitaxial Si–Ge Etch Stop Layers with Ethylene Diamine Pyrocatechol for Bonded and Etchback Silicon–on–Insulator," *Journal of Electronic Materials*, vol. 23, No. 6 (Jun. 1994) pp. 493–496.

Bruel, "Silicon on Insulator Material Technology," *Electronic Letters*, vol. 13, No. 14 (Jul. 6, 1995) pp. 1201–1202.

Bruel et al., "®SMART CUT: A Promising New SOI Material Technology," *Proceedings 1995 IEEE International SOI Conference* (Oct. 1995) pp. 178–179.

Ismail, "Si/SiGe High–Speed Field–Effect Transistors," *Electron Devices Meeting, Washington, D.C.* (Dec. 10, 1995) pp. 20.1.1–20.1.4.

Sadek et al., "Design of Si/SiGe Heterojunction Complementary Metal–Oxide–Semiconductor Transistors," *IEEE Trans. Electron Devices*, (Aug. 1996) pp. 1224–1232.

Usami et al., "Spectroscopic study of Si–based quantum wells with neighboring confinement structure," *Semicon. Sci. Technol.* (1997) (abstract).

König et al., "Design Rules for n–Type SiGe Hetero FETs," *Solid State Electronics*, vol. 41, No. 10 (1997), pp. 1541–1547.

Ishikawa et al., "Creation of Si–Ge–based SIMOX structures by low energy oxygen implantation," *Proceedings 1997 IEEE International SOI Conference* (Oct. 1997) pp. 16–17.

Maiti et al., "Strained–Si heterostructure field effect transistors," *Semicond. Sci. Technol.*, vol. 13 (1998) pp. 1225–1246.

Borenstein et al., "A New Ultra–Hard Etch–Stop Layer for High Precision Micromachining," *Proceedings of the 1999 $12^{th}$ IEEE International Conference on Micro Electro Mechanical Systems (MEMs)* (Jan. 17–21, 1999) pp. 205–210.

Ishikawa et al., "SiGe–on–insulator substrate using SiGe alloy grown Si(001)," *Applied Physics Letters*, vol. 75, No. 7 (Aug. 16, 1999) pp. 983–985.

Mizuno et al., "Electron and Hold Mobility Enhancement in Strained–Si MOSFET's on SiGe–on–Insulator Substrates Fabricated by SIMOX Technology," *IEEE Electron Device Letters*, vol. 21, No. 5 (May 2000) pp. 230–232.

Yeo et al., "Nanoscale Ultra–Thin–Body Silicon–on–Insulator P–MOSFET with a SiGe/Si Heterostructure Channel," *IEEE Electron Device Letters*, vol. 21, No. 4 (Apr. 2000) pp. 161–163.

Huang et al., "High–quality strain–relaxed SiGe alloy grown on implanted silicon–on–insulator substrate," *Applied Physics Letters*, vol. 76, No. 19 (May 8, 2000) pp. 2680–2682.

Hackbarth et al., "Alternatives to thick MBE–grown relaxed SiGe buffers," *Thin Solid Films*, vol. 369, No. 1–2 (Jul. 2000) pp. 148–151.

Barradas et al., "RBS analysis of MBE–grown SiGE/(001) Si heterostructures with thin, high Ge content SiGe channels for HMOS transistors," *Modern Physics Letters B* (2001) (abstract).

* cited by examiner

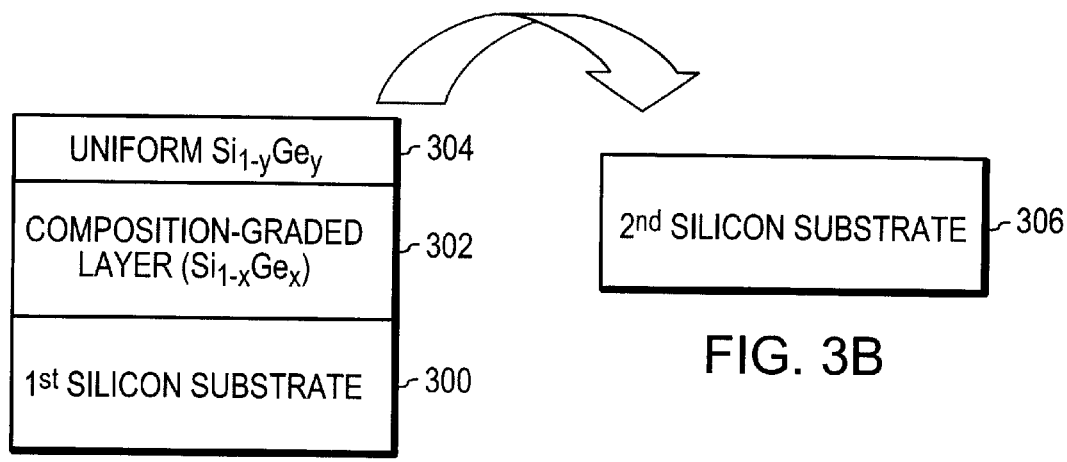
FIG. 3A
FIG. 3B
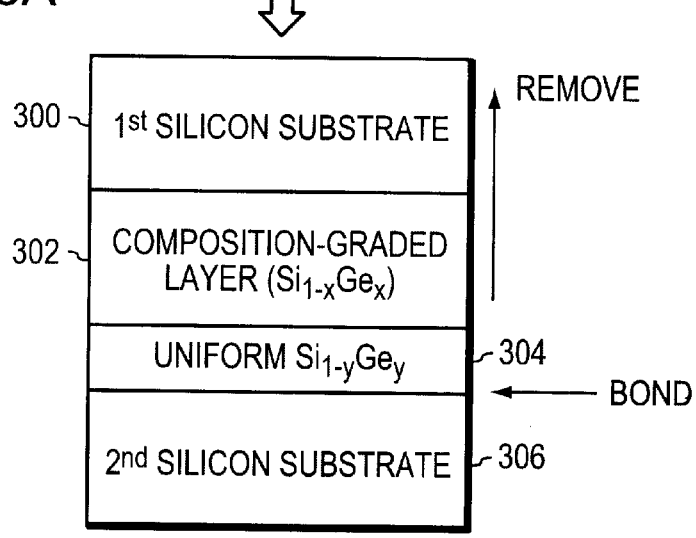
FIG. 3C
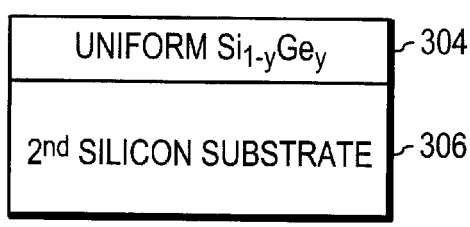
FIG. 3D

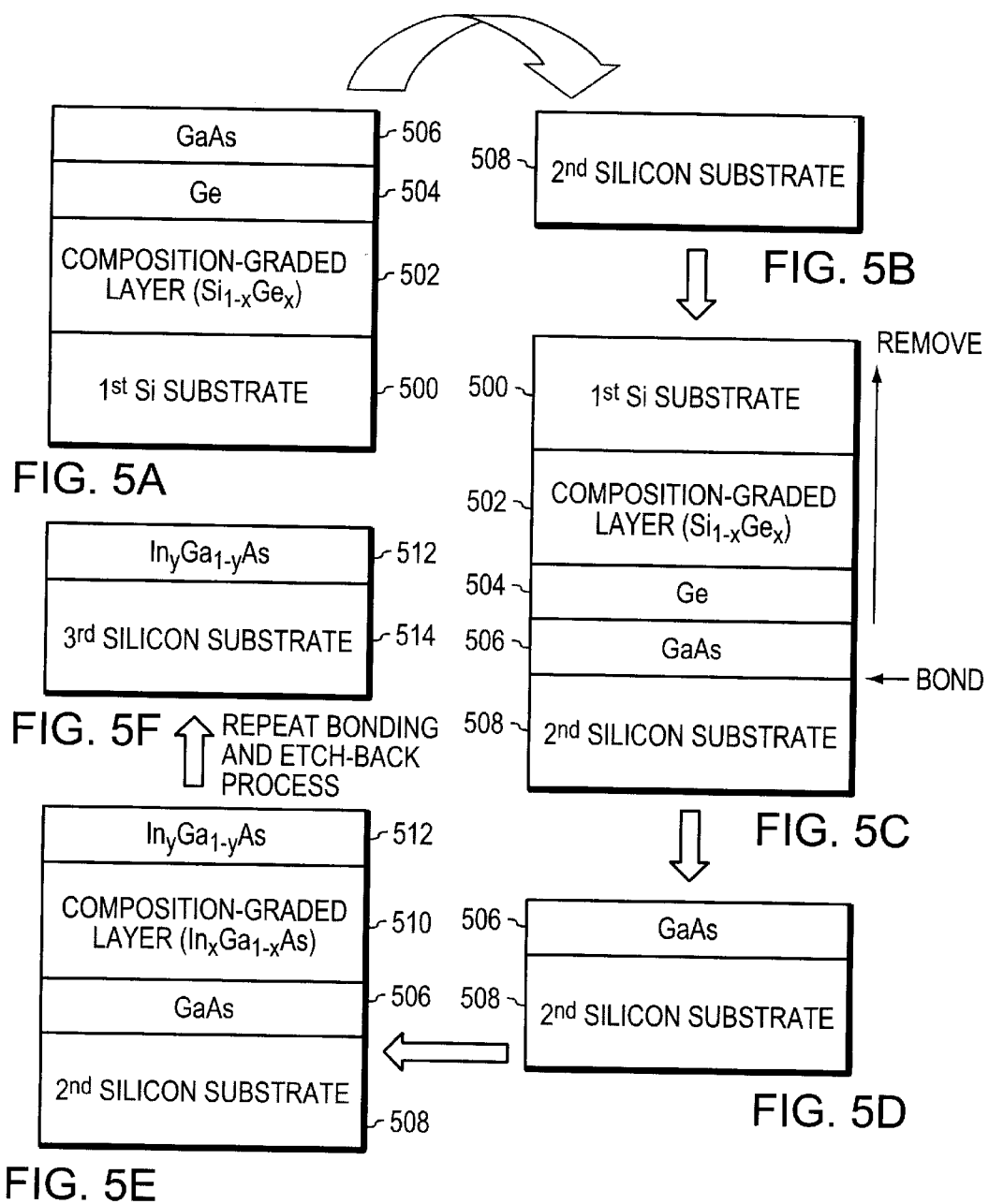

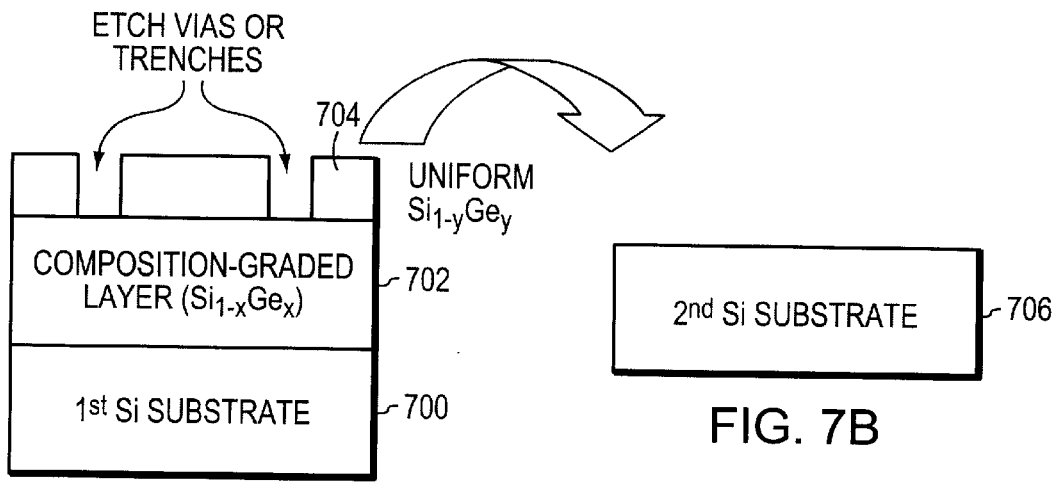
FIG. 7A
FIG. 7B
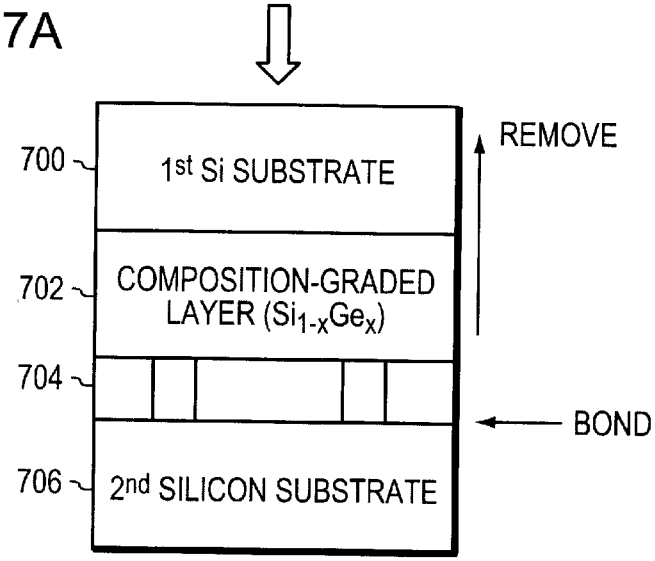
FIG. 7C
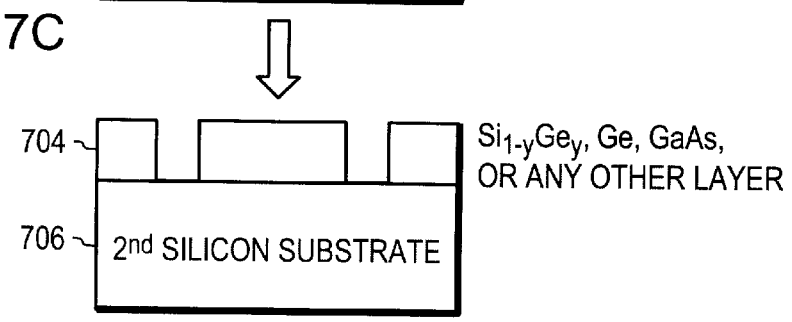
FIG. 7D

HETEROINTEGRATION OF MATERIALS USING DEPOSITION AND BONDING

PRIORITY INFORMATION

This application claims priority from provisional application Ser. No. 60/177,084 filed Jan. 20, 2000.

BACKGROUND OF THE INVENTION

The invention relates to the field of heterointegration of materials using deposition and bonding.

The goal of combining different materials on a common substrate is desirable for a variety of integrated systems. Specifically, it has been a long-standing desire to combine different semiconductor and oxide materials on a common useful substrate such as a silicon substrate. However, just as the different materials properties are beneficial from the system application perspective, other properties make such materials combinations problematic in processing.

For example, semiconductor materials with different properties often have different lattice constants. Therefore, deposition of one semiconductor material on top of another substrate material results in many defects in the semiconductor layer, rendering it useless for practical application. Another method of integrating materials is through the use of wafer bonding. The bonding process removes the lattice mismatch problem. However, this problem is replaced with a mismatch in thermal expansion. Due to the different thermal expansion coefficients in the bonded materials, the materials cannot be subsequently processed or annealed at optimum temperatures without inducing material degradation (i.e. greater residual stress or introduction of dislocations). A final issue is that due to the different material properties, the bulk crystal materials are often different size (boule diameter). This disparity is undesirable for wafer bonding since only a portion of the composite is useful for device/system fabrication.

SUMMARY OF THE INVENTION

Accordingly, the invention provides a semiconductor structure including a first substrate, and an epitaxial layer bonded to the substrate. The epitaxial layer has a threading dislocation density of less than $10^7$ cm$^{-2}$ and an in-plane lattice constant that is different from that of the first substrate and a second substrate on which the epitaxial layer is fabricated. In an exemplary embodiment, the epitaxial layer is a segment of a previously fabricated layered structure including the second substrate with a compositionally graded layer and the epitaxial layer provided thereon. The second substrate and the graded layer are removed subsequent to the layered structure being bonded to the first substrate.

In accordance with another exemplary embodiment of the invention, there is provided a method of processing a semiconductor structure including providing a first substrate; providing a layered structure including a second substrate having an epitaxial layer provided thereon, the epitaxial layer having an in-plane lattice constant that is different from that of the first substrate and a threading dislocation density of less than $10^7$ cm$^{-2}$; bonding the first substrate to the layered structure; and removing the second substrate.

BRIEF DESCRIPTION OF THE DRAWINGS

FIGS. 3A–3D are a process flow block diagram for producing a high quality SiGe layer on Si without the presence of a graded buffer layer using wafer bonding and substrate removal;

FIGS. 5A–5F are a process flow block diagram for producing a high quality InGaAs layer directly on Si by iterating the graded layer bonding process;

FIGS. 7A–7D are a process flow block diagram for producing high quality mismatched epitaxial layers directly on Si using patterned trenches in the epitaxial layer as a sink for dislocations and for strain relief.

DETAILED DESCRIPTION OF THE INVENTION

The invention involves a semiconductor structure and a method of producing a thin, low dislocation density, epitaxial film directly on a lattice mismatched substrate. A thin layer of a material can be deposited on a substrate including a different material using a graded layer to taper any materials properties difference. The graded composition layer often poses a limit to many applications, since the graded layer possesses many dislocations and is quite thick relative to other epitaxial layers and to typical step-heights in CMOS processes. However, if the surface of the deposited semiconductor material is relatively free of defects, the surface can be bonded to another substrate. Subsequently, the original substrate and graded layer can be removed to produce an integrated layer on the desired substrate without the graded region.

Three semiconductor substrates dominate the substrate market: Si, GaAs, and InP. The volumes and diameters of the wafers scale accordingly: Si has the largest wafer size (8 inch, moving to 12 inch) and volumes, GaAs is the next largest (4 inch, moving to 6 inch diameter), and InP trails with the smallest volumes and wafer size (2 inch, moving to 3 and 4 inch). The lattice constant of the substrate increases from Si to GaAs to InP, and the mechanical strength decreases with increasing lattice constant. Thus, Si is the easiest crystal to grow to large diameter with great perfection, whereas InP is the most difficult of the three.

Although the mechanical strength was one of the many reasons that Si began as the favored substrate, the ability to make metal-oxide-semiconductor field-effect-transistors (MOSFETs) allowed markets, chip size, and wafer size to grow rapidly, installing an infrastructure world-wide that continues to make Si the low-cost platform for microelectronics. GaAs and InP are useful in some electronics applications; however, their markets are primarily driven by optoelectronics. Integrating GaAs or InP devices on a Si substrate has tremendous advantages since it allows for the integration of Si electronics with optical devices. However, due to the discrepancy in wafer diameters, a straight bonding process results in only a portion of the Si wafer being covered with GaAs or InP. Because the wafer size difference involves both market size and technology issues, it is a significant barrier to the successful integration of III-V materials with Si using wafer bonding.

Figure 1:
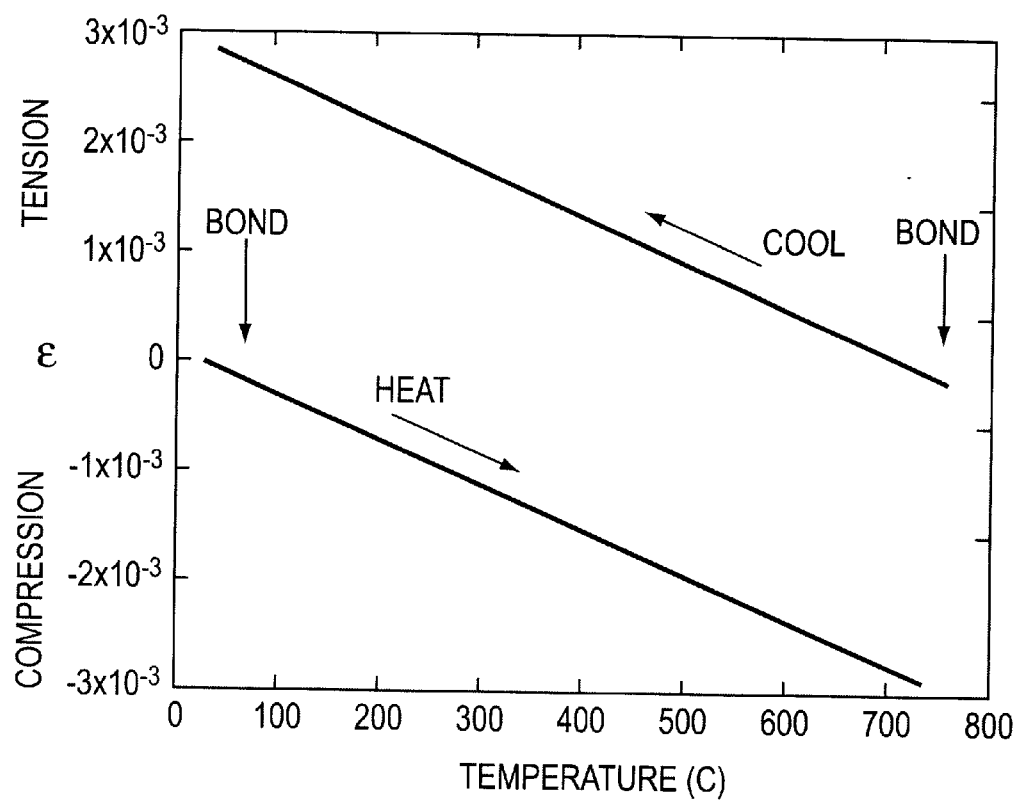
FIG. 1 is a graph showing the strain induced when a 500 µm thick GaAs wafer and a 500 µm thick Si wafer are bonded at room temperature and annealed at high temperature, and bonded at high temperature and cooled to room temperature.

The other issue in question is the thermal expansion difference between the substrate materials being bonded. FIG. 1 is a plot of the strain developed if a GaAs wafer and a Si wafer (each 500 $\mu$m thick) are brought in contact at room temperature and heated for bonding, as well as the case where the wafers are bonded at high temperature and cooled down to room temperature. The strains are approximate, using only the linear term in the thermal expansion of the lattice with temperature. Note that if the wafers are bonded at room temperature and heated, a significant strain develops in the bonded pair. This strain can either crack the assembly, or simply cause the wafers to debond. The additional driving force for debonding can be calculated using the Stoney formula, which describes the curvature of a composite structure like the two bonded wafers:

$$\left(\frac{d_f + d_s}{2}\right) F_f = \frac{w}{12\,R} [Y_f d_f^3 + Y_s d_s^3]$$

where $d_s$ is the thickness of the substrate, $d_f$ is the thickness of the film, $F_f$ is the force on the film, w is the width of the film and substrate, R is the radius of curvature, $Y_f$ is the biaxial modulus of the film, and $Y_s$ is the biaxial modulus of the substrate.

If the substrate and film have an equal thickness of 500 $\mu$m (d=$d_s$=$d_f$), the formula simplifies to:

$$R = \frac{d}{12\varepsilon}\left[1 + \frac{Y_{Si}}{Y_{GaAs}}\right].$$

Figure 2:
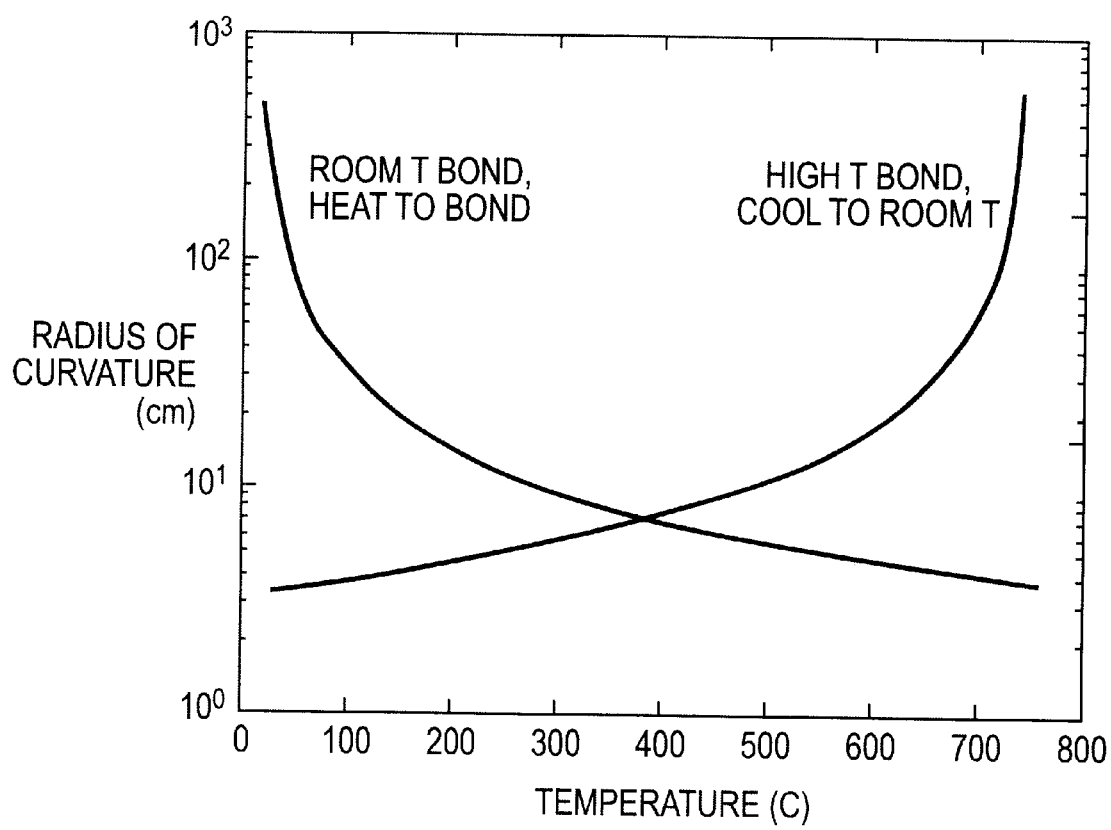
FIG. 2 is a graph showing the curvature induced when a 500 µm thick GaAs wafer and a 500 µm thick Si wafer are bonded under two conditions: bonding at room temperature and subsequently annealing at high temperature anneal, and bonding at high temperature and subsequently cooling to room temperature.
Figure 4A:
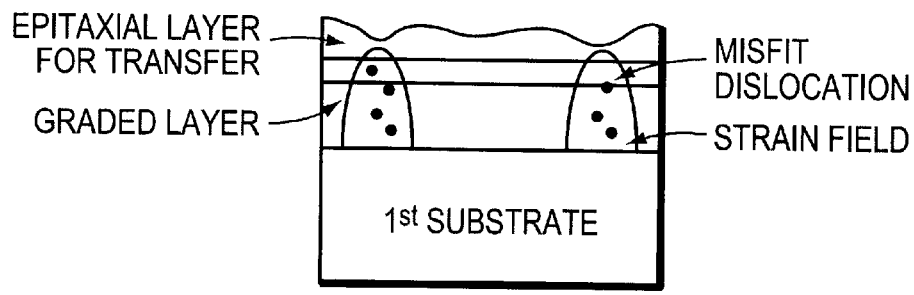
FIGS. 4A–4D are a process flow block diagram showing planarization steps used to improve the surface quality before bonding or after substrate removal.
Figure 4B:
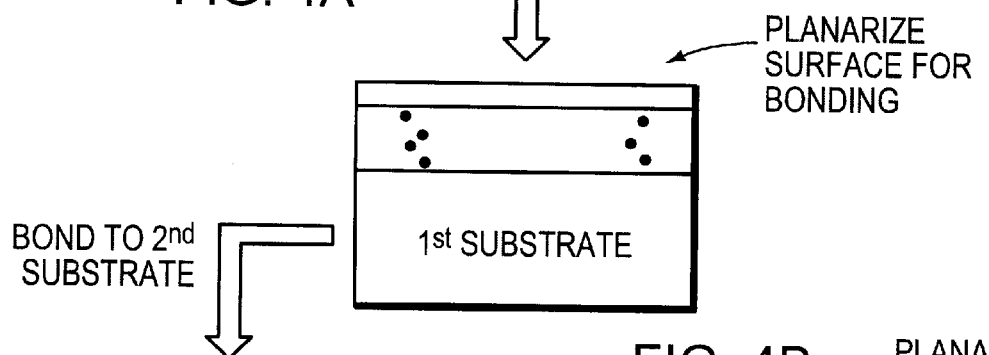
Figures 4C, 4D:
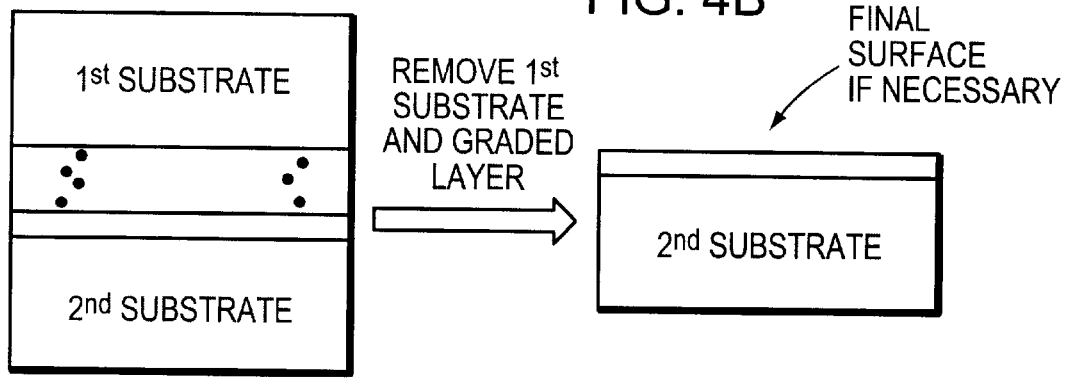

FIG. 2 is a plot of the curvature of the substrate composite of a GaAs wafer bonded to a Si wafer, for the case of bonding at room temperature and heating, as well as bonding at high temperature and cooling. In the case of bonding at room temperature and heating, the combination of the strain shown in FIG. 1 and the resulting curvature shown in FIG. 2 leads to debonding. In the case of bonding at high temperature, the bonding is very strong, and therefore the substrate composite at room temperature is curved, rendering the material useless in most fabrication facilities, especially Si CMOS facilities, where wafer flatness is very important for compatibility with processing equipment. In addition, the substrate composite contains enough strain energy that it is energetically feasible to introduce cracks, and thus the composite tends to fracture spontaneously or with slight mechanical abrasion.

In order to understand how the current invention circumvents the two issues described, the case of integrating a Ge layer or GaAs layer onto a crystalline Si substrate will now be described. FIGS. 3A–3D are a process flow block diagram for producing a high quality SiGe layer on Si without the presence of a graded buffer layer using wafer bonding and substrate removal in accordance with an exemplary embodiment of the invention.

Initially, a graded layer 302 of SiGe is provided on a Si substrate 300 to produce the desired lattice constant with a minimal number of threading dislocations at the top surface. For a review of this process, see E. A. Fitzgerald et al., J. Vac. Sci. and Tech. B 10, 1807 (1992), incorporated herein by reference. Through this process, a uniform SiGe layer 304 is produced at the surface of the structure, even though a silicon substrate exists below. The Ge concentration in this $Si_{1-x}Ge_x$ virtual substrate can range from 0.5–100% (0.005<x<1). The SiGe surface is then bonded to a second silicon wafer 306, or, if the graded layer is graded to pure Ge, a Ge or GaAs layer deposited on the Ge can be bonded to the silicon wafer. Whatever the surface layer composition, the original substrate 300 (on which the graded layer was deposited) as well as the graded layer 302 are then removed, producing a relaxed novel material directly on silicon.

Although compositional grading allows control of the surface material quality, strain fields due to misfit dislocations in the graded layer can lead to roughness at the surface of the epitaxial layer. This roughness poses a problem for wafer bonding, where smooth surfaces are required for strong, uniform bonded interfaces. Implementation of a planarization technique, such as chemomechanical polishing (CMP), before bonding will eliminate this surface roughness and thus enable high quality bonds.

FIGS. 4A–4D are a process flow block diagram showing planarization steps used to improve the surface quality before bonding or after substrate removal. Initially, a graded layer 402 is provided on a substrate 400 to produce the desired lattice constant with a minimal number of threading dislocations at the top surface. A uniform epitaxial layer 404 for transfer is produced at the surface of the structure. The surface of the epitaxial layer 404 is then planarized so it can be bonded to a second substrate 406. The original substrate 400 (on which the graded layer was deposited) as well as the graded layer 402 are then removed, resulting in a relaxed material directly on the second substrate.

Additionally, planarization techniques can be used on the relaxed layer after the original substrate and graded layer are removed. This step is useful if the substrate removal produces a rough surface (as in delamination techniques).

The practical success of the invention is that the thermal expansion coefficient of the two substrate materials are similar or identical, and the wafers are of the same diameter. Thus, the graded layer method of creating a virtual substrate material on top of silicon removes the two constraints that have prevented wafer bonding from effectively producing large areas of heterogeneously integrated materials. With this technique, GaAs, Ge, and any concentration of SiGe can be integrated on Si without the presence of thick graded layers.

It is important to note that although the wafer composite is guaranteed to be nearly flat due to the two substrates being identical material, the epitaxial layers have different thermal expansion coefficients than the substrates and thus experience a large stress and strain. If the thermally induced strain is high enough, it is possible to cause further relaxation of the epitaxial layers. In principle, this relaxation can be benign. For example, if the strain level is great enough to command threading dislocation motion at a given temperature, but the strain level is low enough that the nucleation of new dislocations is not encouraged, then no negative effect will be encountered.

This level of strain can be beneficial. If patterns have been etched in the epitaxial layers before bonding, the threading dislocation motion created by the strain moves the threading dislocations to the pattern edges, thus lowering the effective threading dislocation density at the top surface of the epitaxial layers. However, too high a strain level due to excessive heating of the bonded composite will nucleate new dislocations, increasing the threading dislocation density in the epitaxial layer. A guideline for defining the excess strain level for dislocation nucleation can be gleaned from the known experimental data in a myriad of lattice-mismatched semiconductor systems. For lattice mismatches near 1% or less, the threading dislocation density is usually less than $10^7$ cm$^{-2}$, and thus may not increase the threading dislocation density over the level already present in the layers ($10^5$–$10^6$ cm$^{-2}$). For greater than approximately 1–1.5% strain, the threading dislocation density in relaxed material is quite high. Thus, the objective is to not let the strain in the sandwiched epitaxial layer approach 1% in order to minimize the chance for increased threading dislocation density.

The synergy of combining the graded layer and bonding methods extends beyond the embodiments described. For example, the process can be repeated multiple times, and the process remains economical since inexpensive Si wafers are used for the original host wafers. FIGS. 5A–5F are a process flow block diagram for producing a high quality InGaAs layer directly on Si by iterating the graded layer bonding process. Multiple process iterations can be used to integrate InGaAs alloys on Si. In order to produce InGaAs on Si with only compositional grading, a Si substrate 500 is graded from Si to a pure Ge layer 504 using a SiGe grading layer 502, and subsequently graded from GaAs to InGaAs by depositing a GaAs layer 506 and grading the In composition with a graded layer 510. However, for high In concentrations, a thick region of graded InGaAs is needed to keep the threading dislocation density low at the surface. This great thickness results in cracking upon cooling from the growth temperature.

The invention can be used to first create a thin layer of GaAs 506 on a Si substrate 508 in which the Ge 504 and SiGe 502 graded layers have been removed. Subsequently, In can be compositionally graded to achieve the desired InGaAs layer 512. The fact that the SiGe and Ge are removed allows for the grading of thicker InGaAs layers, since Ge has a similar thermal expansion coefficient as the III-V materials. If the graded InGaAs layer were undesirable in a particular application, then the process can be repeated to produce InGaAs directly on a Si substrate 514. If the In concentration in the graded layer 510 is graded to near 50% In, then this method can be used for creating InP layers on Si, useful for optoelectronic integration of $\lambda=1.55$ μm devices with Si electronics.

It will be appreciated that a thin Ge or III-V material layer on Si can be created with the process shown in FIGS. 5A–5F. These materials are very useful in fabricating optoelectronic integrated circuits (OEICs) on Si. The thin layer might be Ge or GaAs or In$_{0.5}$Ga$_{0.5}$P after SiGe grading, or may also be InGaAs or InP after InGaAs grading. Essentially, by utilizing either one or multiple bonding sequences, thin layers of Si$_{1-t}$Ge$_t$, Al$_v$(In$_w$Ga$_{1-w}$)$_{1-v}$As, or (In$_x$Ga$_{1-x}$)$_z$(As$_{1-y}$P$_y$)$_{1-z}$ can be produced on a mismatched substrate where $0.005<t<1$, $0<v<1$, $0<w<1$, $0<x<1$, $0<y<1$, and $0<z<1$. These thin layers are removed from the areas where Si electronics are to be fabricated using standard photolithography. The remaining areas containing the thin material for optoelectronics are protected with a SiO$_2$ layer or other material during Si circuit processing. After substantial Si circuit processing, removing the SiO$_2$ exposes the thin optoelectronic areas, and subsequently optoelectronic devices are fabricated.

An advantageous feature of the invention is the ability to integrate a thin layer. After removal of the original wafer and graded layer, only a thin layer of the thermally mismatched material is present. Thus, the thin film on thick substrate approximation holds:

$$R = \frac{1}{6\varepsilon_f}\left(\frac{Y_s}{Y_f}\right)\frac{d_s^2}{d_f}.$$

For a thin film of 0.1 μm GaAs on a 500 μm Si substrate, the radius of curvature is always much greater than $10^4$ cm for the temperature range of room T to 750° C. for the structure. Such a small amount of curvature will not affect most processing. However, if there is a need to remove this small curvature, other epitaxial layers and/or layers on the backside of the wafer can be deposited to easily compensate for the strain, leading to wafers with less curvature.

Figure 6:
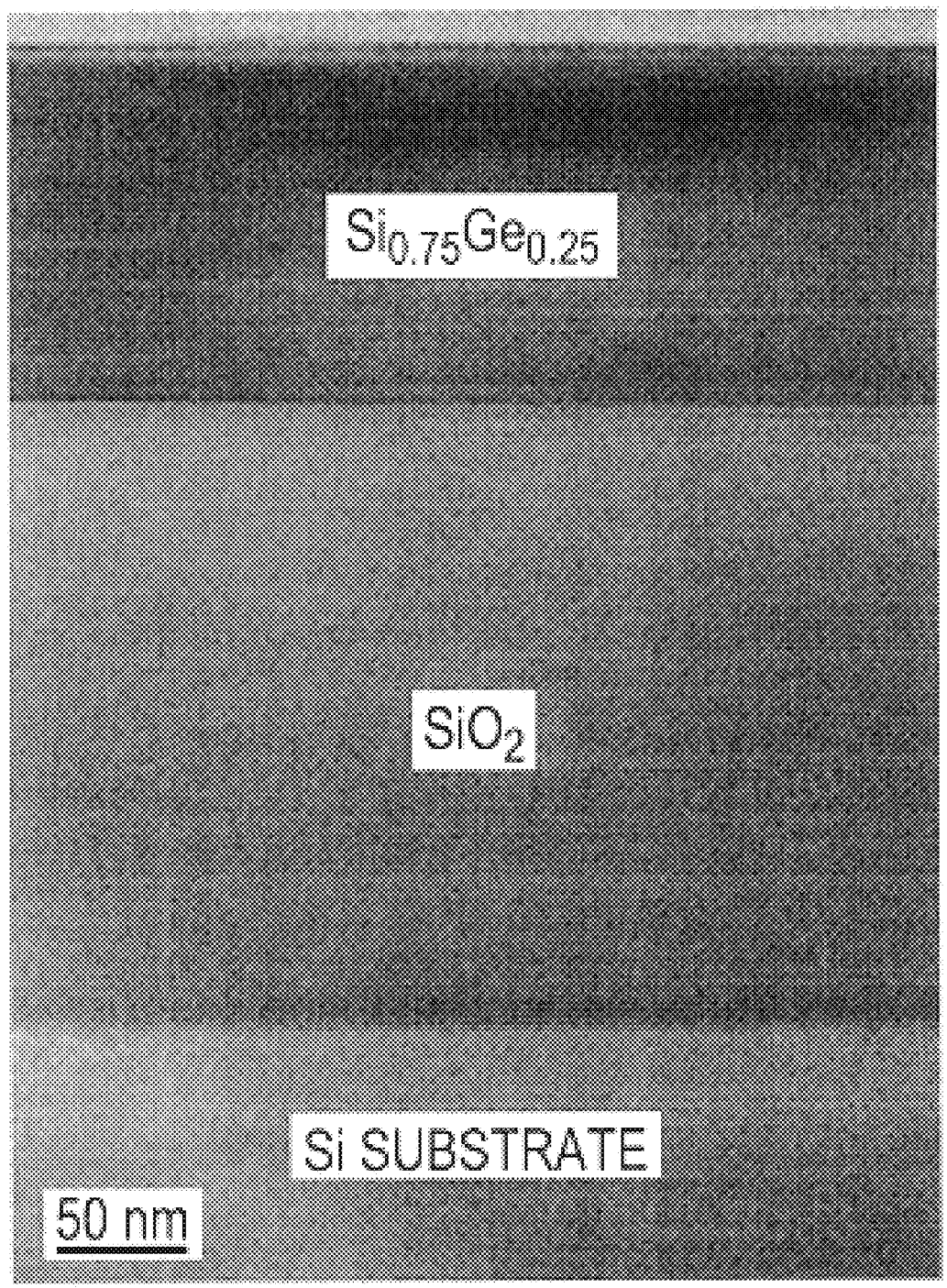
FIG. 6 is a cross-sectional transmission electron micrograph of a relaxed, low dislocation density SiGe film on an oxidized substrate.

All of the provided examples exemplify semiconductor/semiconductor bonding. However, other materials present on the wafer surface can be present as well and included by bonding into the structure. For example, instead of bonding only to bare Si surfaces, the epitaxial wafer can be bonded to a Si wafer coated with SiO$_2$. Using the process described, a thin GaAs/SiO$_2$/Si structure is created, which is very useful for optical interconnects. The SiO$_2$ layer allows for both optical and electronic isolation of the top optoelectronic layer. An example of bonding a relaxed SiGe alloy on Si to SiO$_2$/Si is shown in FIG. 6. FIG. 6 is a cross-section transmission electron micrograph of an exemplary SiGe/SiO$_2$/Si structure. The process used to create the material is the same as shown in FIGS. 3A–3D, except the SiGe has been bonded to a Si wafer with SiO$_2$ on its surface.

In addition, in an alternative exemplary embodiment of the invention, a structure can be fabricated in accordance with the previously described process in which the epitaxial layer is eventually applied to a glass substrate rather than a Si substrate. The glass substrate would need to have a thermal expansion coefficient that is similar to that of the substrate on which the epitaxial layer is deposited, e.g., Si.

FIGS. 7A–7D are a process flow block diagram for producing high quality mismatched epitaxial layers directly on Si using patterned trenches in the epitaxial layer as a sink for dislocations and for strain relief in accordance with an alternative exemplary embodiment of the invention. A graded layer 702, e.g., SiGe, Ge or GaAs, is provided on a first Si substrate 700. This layer is graded until a uniform layer 704 is produced. The uniform layer 704 is then patterned with vias and/or trenches before the bonding process. A second Si substrate is bonded to the uniform layer 704. Subsequently, the first Si substrate 700 and the graded layer 702 are removed resulting in a uniform layer, e.g., Si$_{1-y}$Ge$_y$, provided directly on a Si substrate.

In this way, tensile stress in the original graded structure is relieved, aiding the bonding operation. This variant also produces a flat structure with isolated patterns after release. For example, an array of trenches produces a series of mesas on the surface, and after bonding and removal, these mesas are areas of isolated, relaxed layers. In this embodiment, the epitaxial layer will not contribute to thermal bowing of the new structure. Additionally, since these mesas are isolated, the edges of the mesas act as sinks for dislocations, and thus thermal cycling of the material further reduces the threading dislocation density.

In all of the above processes, there are various ways of removing the graded layer/original substrate. One method is the well-known etch-back process, where the substrate is physically ground until quite thin, and then a chemical etch is used to stop at a particular layer. Another technique is the hydrogen-implant technique, in which a high dose of hydrogen is implanted below the surface of the layer to be released (in this case, the surface of the original substrate plus graded layer and uniform layer). After bonding, it is possible to fracture the implanted region, removing the original graded layer and substrate, and leaving the desired transferred layer.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
   a first substrate; and
   an epitaxial layer bonded to said substrate, said epitaxial layer having a threading dislocation density of less than $10^7$ cm$^{-2}$ and an in-plane lattice constant different from that of said first substrate.

2. The structure of claim 1, wherein said epitaxial layer is a segment of a previously fabricated layered structure including said second substrate with a compositionally graded layer and said epitaxial layer provided thereon, said second substrate and said graded layer being removed subsequent to said layered structure being bonded to said first substrate.

3. The structure of claim 2, wherein the epitaxial layer is planarized prior to being bonded to said first substrate.

4. The structure of claim 2, wherein the epitaxial layer is planarized by chemomechanical polishing.

5. The structure of claim 2, wherein the epitaxial layer is planarized after the second substrate and graded layer are removed.

6. The structure of claim 2, wherein the epitaxial layer is planarized by chemomechanical polishing after the second substrate and graded layer are removed.

7. The structure of claim 1, wherein said first substrate comprises Si.

8. The structure of claim 7, wherein said first substrate includes a surface layer of SiO$_2$.

9. The structure of claim 1, wherein the epitaxial layer comprises Si$_{1-x}$Ge$_x$ with 0.005<x<1.

10. The structure of claim 9, wherein the epitaxial layer is planarized.

11. The structure of claim 10, wherein the epitaxial layer is planarized by chemomechanical polishing.

12. The structure of claim 10, wherein said first substrate comprises Si.

13. The structure of claim 12, wherein said first substrate includes a surface layer of SiO$_2$.

14. The structure of claim 1, wherein the epitaxial layer comprises Al$_y$(In$_x$Ga$_{1-x}$)$_{1-y}$As.

15. The structure of claim 1, wherein the epitaxial layer comprises In$_x$Ga$_{1-x}$As.

16. The structure of claim 1, wherein the epitaxial layer comprises GaAs.

17. The structure of claim 14, wherein the epitaxial layer is planarized.

18. The structure of claim 17, wherein the epitaxial layer is planarized by chemomechanical polishing.

19. The structure of claim 17, wherein said first substrate comprises Si.

20. The structure of claim 19, wherein said first substrate includes a surface layer of SiO$_2$.

21. The structure of claim 1, wherein the epitaxial layer comprises (In$_x$Ga$_{1-x}$)$_z$(As$_{1-y}$P$_y$)$_{1-z}$.

22. The structure of claim 1, wherein the epitaxial layer comprises In$_x$Ga$_{1-x}$P.

23. The structure of claim 1, wherein the epitaxial layer comprises InP.

24. The structure of claim 21, wherein the epitaxial layer is planarized prior to being bonded to said first substrate.

25. The structure of claim 24, wherein the epitaxial layer is planarized by chemomechanical polishing.

26. The structure of claim 21, wherein said first substrate comprises Si.

27. The structure of claim 26, wherein said first substrate includes a surface layer of SiO$_2$.

28. The structure of claim 2, wherein said layered structure comprises a crystalline substrate, said graded composition layer and a threading dislocation density at the surface of said second substrate which is less than $10^7$ cm$^{-2}$.

29. The structure of claim 2, wherein said layered structure comprises a crystalline substrate, said graded composition layer, a uniform composition layer and a threading dislocation density at the surface of said second substrate which is less than $10^7$ cm$^{-2}$.

30. The structure of claim 29, wherein the surface of the layered structure is planarized.

31. The structure of claim 30, wherein the surface of the layered structure is planarized by chemomechanical polishing.

32. The structure of claim 29, wherein said first substrate comprises Si.

33. The structure of claim 32, wherein said first substrate includes a surface layer of SiO$_2$.

34. The structure of claim 29, wherein the graded composition layer comprises Si$_{1-x}$Ge$_x$ where the composition is approximately linearly varied from approximately x=0 to a final composition, and the uniform composition layer comprises Si$_{1-y}$Ge$_y$.

35. The structure of claim 34, wherein the crystalline substrate comprises Si.

36. The structure of claim in 35, wherein the epitaxial layer comprises Si$_{1-x}$Ge$_x$ with 0.005<x<1.

37. The structure of claim 35, wherein y is approximately 1 and the epitaxial layer comprises GaAs.

38. The structure of claim 35, wherein y is approximately 1 and the epitaxial layer comprises In$_z$Ga$_{1-z}$P, where z is approximately 0.5.

39. The structure of claim 34, wherein the epitaxial layer is planarized.

40. The structure of claim 39, wherein the epitaxial layer is planarized by chemomechanical polishing.

41. The structure of claim 39, wherein said first substrate comprises Si.

42. The structure of claim 41, wherein said first substrate includes a surface layer of SiO$_2$.

43. The structure of claim 29, wherein the graded composition layer comprises Al$_y$(In$_x$Ga$_{1-x}$)$_{1-y}$As, where the composition is approximately linearly varied from approximately x=0 to a the final composition, and the uniform composition layer comprises Al$_w$(In$_z$Ga$_{1-z}$)$_{1-w}$As.

44. The structure of claim 43, wherein the crystalline substrate comprises a GaAs epitaxial layer on a Si substrate.

45. The structure of claim 43, wherein the crystalline substrate comprises a Ge epitaxial layer on a Si substrate.

46. The structure of claim 43, wherein the crystalline substrate comprises a Si$_{1-x}$Ge$_x$ epitaxial layer on a graded composition Si$_{1-y}$Ge$_y$ layer, which is on a Si substrate.

47. The structure of claim 43, wherein said epitaxial layer comprises In$_x$Ga$_{1-x}$As.

48. The structure of claim 43, wherein said uniform composition layer comprises In$_x$Ga$_{1-x}$As, where x is approximately 0.5, and said epitaxial layer comprises InP.

49. The structure of claim 43, wherein the epitaxial layer is planarized.

50. The structure of claim 49, wherein the epitaxial layer is planarized by chemomechanical polishing.

51. The structure of claim 49, wherein said first substrate comprises Si.

52. The structure of claim 51, wherein said first substrate includes a surface layer of $SiO_2$.

53. The structure of claim 29, wherein said graded composition layer comprises $(In_xGa_{1-x})_z(As_{1-y}P_y)_{1-z}$, where the composition is approximately linearly varied from approximately x=0 to a final composition, and the uniform composition layer comprises $(In_uGa_{i-u})_v(As_{1-w}P_w)_{1-v}$.

54. The structure of claim 53, wherein the crystalline substrate comprises a GaAs epitaxial layer on a Si substrate.

55. The structure of claim 53, wherein the crystalline substrate comprises a $Si_{1-x}Ge_x$ epitaxial layer on a graded composition $Si_{1-y}Ge_y$ layer, which is on a Si substrate.

56. The structure of claim 53, wherein the crystalline substrate comprises a Ge epitaxial layer on a Si substrate.

57. The structure of claim 53, wherein the surface of the layered structure is planarized.

58. The structure of claim 57, wherein the surface of the layered structure is planarized by chemomechanical polishing.

59. The structure of claim 57, wherein said first substrate comprises Si.

60. The structure of claim 59, wherein said first substrate includes a surface layer of $SiO_2$.

61. The structure of claim 1, wherein said epitaxial layer comprises patterned trenches or vias.

62. The structure of claim 2, wherein said first substrate has a thermal expansion coefficient similar to that of said second substrate.

63. A semiconductor structure comprising:
a first glass substrate; and
an epitaxial layer bonded to said substrate, said epitaxial layer having a threading dislocation density of less than $10^7$ cm$^{-2}$.

64. The structure of claim 63, wherein said epitaxial layer is a segment of a previously fabricated layered structure including said second substrate with a composition graded layer and said epitaxial layer provided thereon, said second substrate and said graded layer being removed subsequent to said layered structure being bonded to said glass substrate.

65. The structure of claim 1, wherein said first glass substrate has a thermal expansion coefficient similar to that aid second substrate.

66. The structure of claim 63, wherein said epitaxial layer comprises $Si_{1-x}Ge_x$ with 0.005<x<1.

67. The structure of claim 63, wherein said epitaxial layer comprises $Al_y(In_xGa_{1-x})_{1-y}As$.

68. The structure of claim 63, wherein the epitaxial layer comprises $(In_xGa_{1-x})_z(As_{1-y}P_y)_1$.

69. The structure of claim 63, wherein said epitaxial layer comprises patterned trenches or vias.

* * * * *